United States Patent
Okuno et al.

(10) Patent No.: US 8,679,289 B2
(45) Date of Patent: Mar. 25, 2014

(54) METHOD AND APPARATUS FOR SEPARATING PROTECTIVE TAPE

(75) Inventors: Chouhei Okuno, Ibaraki (JP); Masayuki Yamamoto, Ibaraki (JP)

(73) Assignee: Nitto Denko Corporation, Osaka (JP)

(*) Notice: Subject to any disclaimer, the term of this patent is extended or adjusted under 35 U.S.C. 154(b) by 162 days.

(21) Appl. No.: 13/274,394

(22) Filed: Oct. 17, 2011

(65) Prior Publication Data
US 2012/0090763 A1  Apr. 19, 2012

(30) Foreign Application Priority Data
Oct. 19, 2010  (JP) .................................. 2010-234495

(51) Int. Cl.
*B32B 38/10* (2006.01)

(52) U.S. Cl.
USPC .......... 156/702; 156/707; 156/714; 156/751; 156/758; 156/764; 156/931; 156/941; 269/21; 438/976

(58) Field of Classification Search
USPC ......... 156/247, 702, 707, 714, 715, 751, 758, 156/759, 764, 930, 931, 941, 942; 269/21; 438/464, 976
See application file for complete search history.

(56) References Cited

U.S. PATENT DOCUMENTS

| | | | |
|---|---|---|---|
| 6,164,894 A * | 12/2000 | Cheng | 414/416.03 |
| 6,241,825 B1 * | 6/2001 | Wytman | 118/733 |
| 7,060,154 B2 | 6/2006 | Yamamoto et al. | |
| 7,763,141 B2 | 7/2010 | Yamamoto | |
| 2008/0023133 A1 * | 1/2008 | Yamamoto | 156/285 |
| 2009/0139662 A1 * | 6/2009 | Nakamura et al. | 156/584 |

FOREIGN PATENT DOCUMENTS

| | | |
|---|---|---|
| JP | 2002-124494 A | 4/2002 |
| JP | 2008-34709 A | 2/2008 |

* cited by examiner

*Primary Examiner* — Mark A Osele
(74) *Attorney, Agent, or Firm* — Cheng Law Group, PLLC

(57) ABSTRACT

A first holding table suction-holds an annular projection of a wafer remaining on a rear face thereof for surrounding a back grinding region. A second holding table having an outer peripheral wall adjacent to an inner wall of the annular projection is inserted into a flat portion inside the annular projection for joining a separating adhesive tape to a protective tape on a surface of the wafer while a flat plane of the flat portion is suction-held. Thereafter, the adhesive tape is separated. Accordingly, the adhesive tape is separated from the surface of the wafer together with the protective tape.

10 Claims, 17 Drawing Sheets

METHOD AND APPARATUS FOR SEPARATING PROTECTIVE TAPE

BACKGROUND OF THE INVENTION (1) Field of the Invention

This invention relates to a method and apparatus for separating a protective tape together with a separating tape through joining the separating tape to the protective tape joined to a surface of a semiconductor wafer (hereinafter, simply referred to as "wafer") having a pattern formed thereon, and then separating the separation tape.

(2) Description of the Related Art

After completion of a pattern forming process, a protective tape is joined to a surface of a wafer, and a back grinding process is uniformly performed to the entire rear face of the wafer. Thereafter, the protective tape is separated from the surface of the wafer, and then the wafer is subjected to a dicing process in which the wafer is divided into chips.

According to a method of separating the protective tape from the surface of the wafer, the wafer is suction-held on a table while the surface, to which the protective tape is joined, of the wafer is directed upward. Then, a separating adhesive tape is joined to the protective tape with a joining roller. Thereafter, the adhesive tape is folded back and separated with an edge member. Accordingly, the protective tape joined to the adhesive tape is separated together from the surface of the wafer. See, Japanese Patent Publication No. 2002-124494.

Recently, the wafer needs to be thinner in response to rapid advance in application. The wafer needs to be thinned to have a thickness of 100 μm to 50 μm, sometimes to around 25 μm. Such a thin wafer having the protective tape joined to the surface thereof is brittle and readily to bend, which leads to difficulty in handling. Accordingly, an annular projection is formed remaining at an outer periphery of the rear face of the wafer as to surround a region where a back grinding is to be performed. Thus, the wafer is reinforced.

When the protective tape is separated from the surface of the wafer surface after a back grinding process, only the annular projection on the rear face of the wafer is brought into contact with the holding table to be suction-held, and fluid is supplied between the holding table and the rear face of the wafer for realizing enhanced internal pressure. The separation tape is joined to the protective tape under this state while traveling and being pressed with the separating member, and is folded back for separation, whereby the protective tape joined to the adhesive tape is separated from the surface of the wafer together with the adhesive tape. See Japanese Patent Publication No. 2008-34709.

The conventional apparatus, however, has the following problem. That is, when the separation tape is joined to the protective tape, clogging may occur on a suction-holding line of the holding table at a position where joining of the separation tape starts, or suction ability may be degraded or eliminated due to failure in a pump. When the separation tape having degraded suction ability is separated, the tension in the separation tape becomes higher than suction to a wafer. The tension may lead to floating of the wafer from the holding table while the wafer is warped. As a result, poor separation and fracture in the wafer may occur. This problem may arise in the apparatus disclosed in both prior arts.

Moreover, in the apparatus disclosed in Japanese Patent Publication No, 2008-34709, the tension in the separation tape is concentrated on a joint portion of the annular projection on the rear face of the wafer and the thinned flat surface inside thereof. As a result, another new problem may arise that a crack is generated in the wafer from the joint portion.

SUMMARY OF THE INVENTION

This invention has been made regarding the state of the art noted above, and its primary object is to provide a protective tape separating method and protective tape separating apparatus that allows separation of a protective tape from a surface of a wafer regardless of a rear face shape of the wafer.

This invention discloses a method of separating a protective tape joined to a semiconductor wafer. The method includes the steps of: suction-holding a rear face of the semiconductor wafer by moving relatively a first holding table and a second holding table upward and downward so as to adjust a level of the first holding table and the second holding table, the first holding table suction-holding at least a separating start position of the protective tape in an outer peripheral region of the rear face of the semiconductor wafer, the second holding table holding a middle region of the semiconductor wafer inside of the outer peripheral region; and separating the protective tape together with the separation tape from the semiconductor wafer while the separation tape joined to a surface of the protective tape on the semiconductor wafer suction-held on the first holding table and the second holding table is separated through folding back with a joining member.

According to this method, the first holding table and the second holding table relatively move upward and downward. Consequently, the rear face of the wafer may be suction-held independently of a step between the outer peripheral region on the rear face of the wafer and the middle region inside thereof.

For instance, the step of suction-holding the rear face of the semiconductor wafer preferably includes the following steps: adjusting the first holding table and the second holding table as to have an identical surface level when suction-holding the semiconductor wafer having a rear face to which a back grinding process is entirely performed uniformly; suction-holding an annular projection with the first holding table through relatively moving the first holding table and the second holding table upward and downward when suction-holding the semiconductor wafer having the annular projection remaining on the outer periphery of the rear face thereof for surrounding a back grinding region; and suction-holding a flat portion formed along an internal diameter of the annular projection with the second holding table having a contour adjacent to an inner wall of the annular projection. Such configuration is preferable.

According to this method, the wafer may accurately be suction-held that is entirely flat on the rear face thereof and has the annular portion on the outer periphery of the rear face of the wafer. Particularly, at least a separation starting position of the protective tape is suction-held. Consequently, the wafer never floats up from the holding table due to a tension in separation of the protective tape. Accordingly, damages of the wafer may positively be avoided.

Moreover, in this method, it is more preferable that a surface level of each the first holding table and the second holding table is adjusted through detecting unevenness at the outer periphery on the rear face of the semiconductor wafer with a detector and using the detect results with a controller.

According to this method, even when the wafers having different shapes of the rear face thereof are supplied to a protective tape separation position, the protective tape may successively be separated from the surface of the wafer while the surface levels of the first and the second holding tables are automatically adjusted in accordance with the shape of the rear face of the wafer. In other words, errors by an operator may be suppressed in setting the surface levels of the first and the second holding tables.

In the foregoing method, it is preferable to control the first and second holding tables as to perform suction-holding independently.

For instance, two or more suction holes formed on the surfaces of the first and second holding tables are brought together for every line along a direction of joining the separation tape, and the suction holes are controlled as to perform suction-holding independently for every line.

According to this method, any of the suction holes suction-holds the rear face of the wafer unless every suction line of the first holding table that suction-holds the separating starting position of the protective tape becomes impossible to operate. Consequently, this method may suppress poor separation of the protective tape that occurs in separation of the protective tape due to poor suction-holding on the rear surface of the wafer in the conventional apparatus.

This invention also discloses apparatus for separating a protective tape joined to a semiconductor wafer. The apparatus includes a first holding table, a second holding table, a tape supply mechanism, a tape separating mechanism, a tape collecting section, a driving mechanism, and a controller. The first holding table suction-holds at least an annular projection on a separation stating position of the protective tape remaining at an outer peripheral region on the rear face of the semiconductor wafer as to surround a back grinding region when the semiconductor wafer having the annular projection is placed, or suction-holds at least the outer peripheral region of the semiconductor wafer on the separation starting position of the protective tape when the semiconductor wafer is placed having the rear face to which a back grinding process is entirely performed uniformly. The second holding table suction-holds a flat portion having a contour adjacent to the internal wall of the annular projection and formed as to conform to an internal diameter of the annular projection when the semiconductor wafer having the annular projection is placed, and suction-holds a middle region of the semiconductor wafer when the semiconductor wafer is placed having the entirely flat rear face. The tape supply mechanism supplies the separation tape to a surface of the protective tape on the semiconductor wafer suction-held on the first holding table and the second holding table. The tape separating mechanism separates the protective tape together with the separation tape while folding back and separating the separation tape joined to the protective tape on the semiconductor wafer with a separation member. The tape collecting section collects the separated protective tape and the separation tape. The drive mechanism moves upward and downward the first holding table and the second holding table. The controller controls suction and relative upward and downward movement of the first holding table and the second holding table.

According to this configuration, the wafer may accurately be suction-held regardless of a rear face shape of the wafer through relatively moving the first and the second holding tables upward and downward.

Specifically, both holding tables may accurately suction-hold a separation line of the separation member on a rear side thereof that moves on the wafer from the separation start position of the separation tape. For instance, the first holding table suction-holds the separation starting position of the protective tape even when a suction line of the second holding table for suction-holding the middle region of the wafer stops operation or reduces its suction upon separation of the tape. Consequently, even when a tension during separation of the tape is applied to the wafer, the wafer never floats up from the first and the second holding tables.

Moreover, when an annular projection exists on the rear face of the wafer from which the protective tape is to be separated, a joint portion of the annular projection and a flat portion inside thereof is reinforced through suction-holding by the second holding table. Accordingly, stress upon warping of the wafer due to a tension in the tape separation is canceled by the reinforcement. Consequently, cracks may be suppressed that possibly occur at the joint portion of the annular projection.

Moreover, the foregoing configuration includes a detector for detecting unevenness on the outer periphery of the rear face of the semiconductor wafer. The controller is configured as to distinguish a semiconductor wafer having a flat rear face from a semiconductor wafer having an annular projection formed at the outer periphery on the rear face thereof in accordance with detection results, and as to control a surface level of the first holding table and the second holding table in accordance with the distinction result. Such configuration is preferable.

According to this configuration, errors by an operator may be suppressed in setting the surface levels of the first and the second holding tables. Moreover, the wafers having various rear faces in shape may be successively processed.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DESCRIPTION OF THE PREFERRED EMBODIMENTS

One embodiment of this invention is now to be described below with reference to the drawings.

Figure 1:
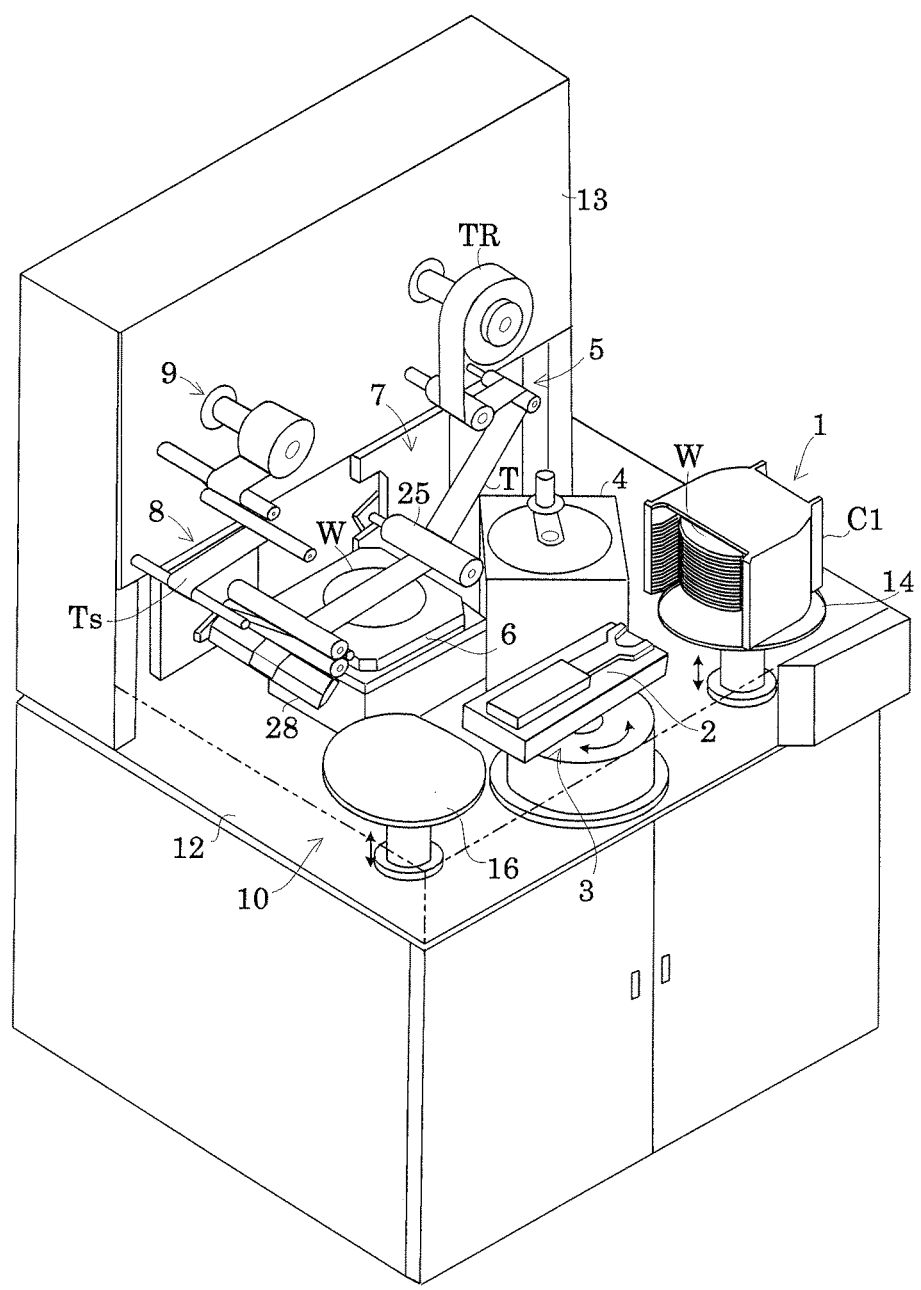
FIG. 1 is a perspective view illustrating a general configuration of protective tape separation apparatus according to a first embodiment.
Figure 2:
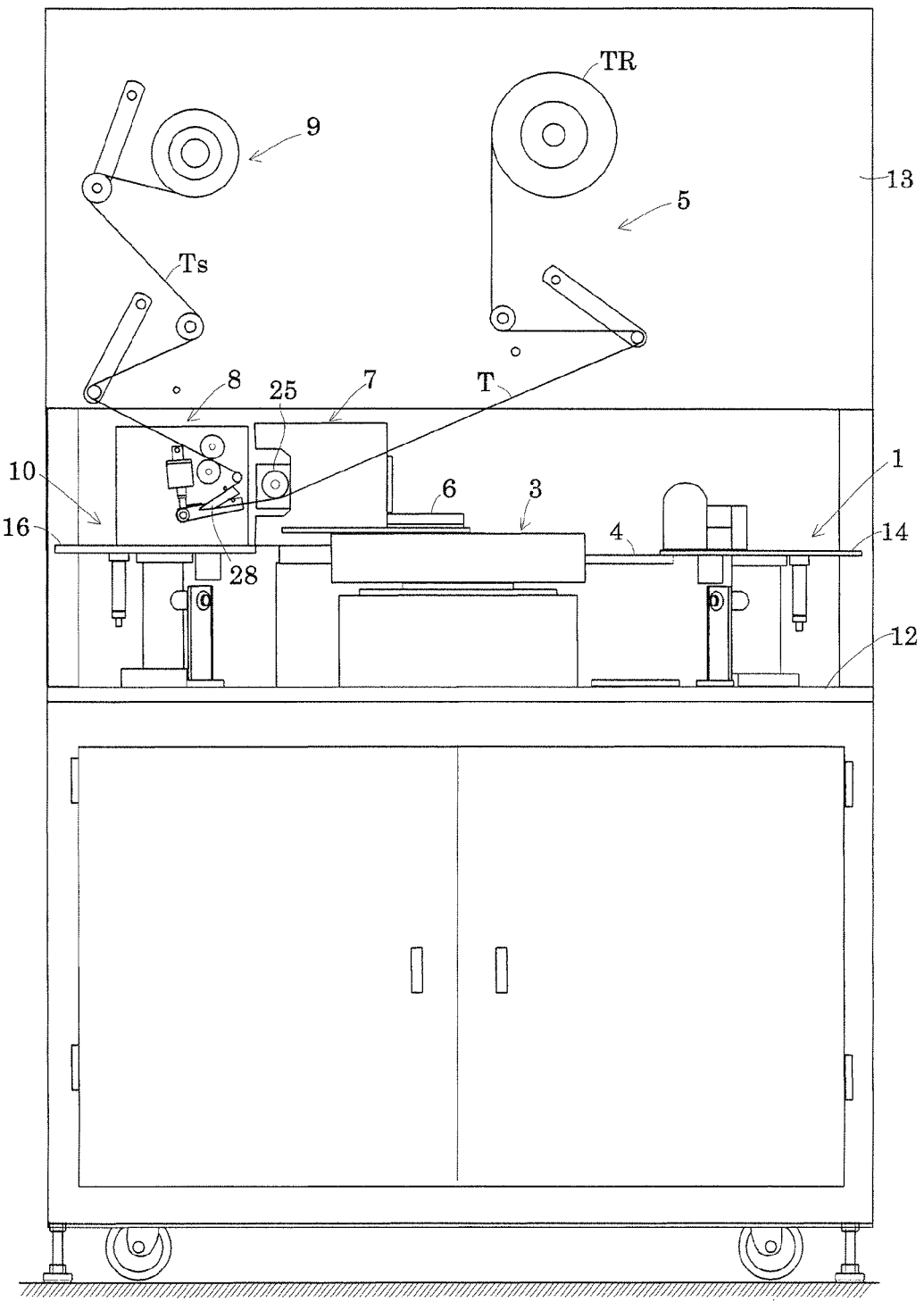
FIG. 2 is a front view illustrating the general configuration of the protective tape separation apparatus according to the first embodiment.
Figure 3:
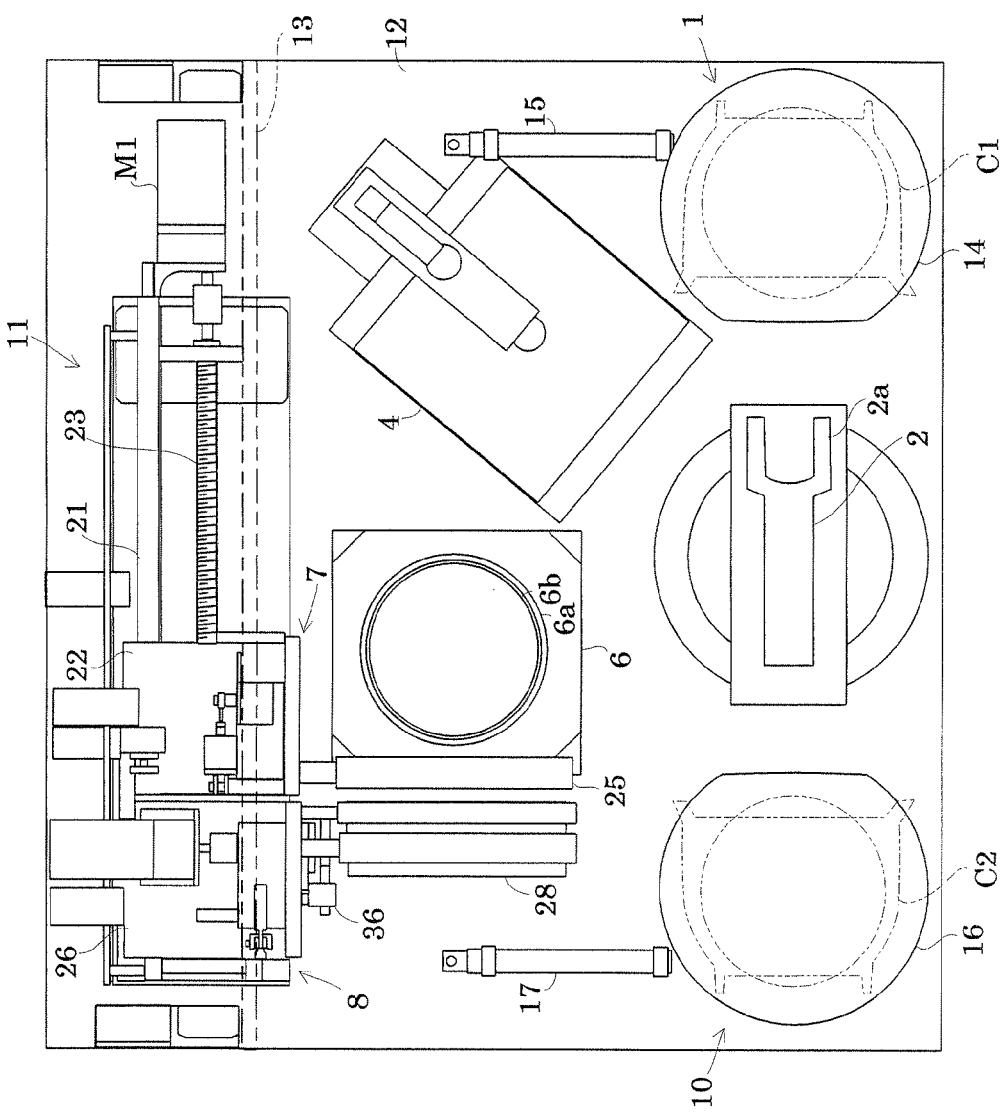
FIG. 3 is a plan view illustrating the general configuration of the protective tape separation apparatus according to the first embodiment.

FIG. 1 is a perspective view illustrating a general configuration of apparatus for separating a protective tape from a semiconductor wafer as one example of the apparatus executing the method according to this invention. FIG. 2 is a front view illustrating the general configuration of the apparatus. FIG. 3 is a plan view illustrating the general configuration of the apparatus.

The protective tape separation apparatus includes a wafer supply section 1, a wafer transport mechanism 3, an alignment stage 4, a tape supply section 5, a holding table 6, a tape joining unit 7, a tape separation unit 8, a tape collecting section 9, a wafer collecting section 10, a unit driving section 11 are provided on a base 12. The wafer supply section 1 includes a cassette C1 for housing wafers W, each of which has been subjected to a back grinding process, in a stacked manner. The wafer transport mechanism 3 is equipped with a robot arm 2. The alignment stage 4 performs alignment on the wafer W. The tape supply section 5 supplies a separating adhesive tape T toward a site where a separating process is performed. The holding table 6 suction-holds the wafer W. The tape joining unit 7 joins the adhesive tape T to the wafer W on the holding table 6. The tape separation unit 8 separates the joined adhesive tape T. The tape collecting section 9 winds up and collects an adhesive tape Ts subjected to the separating process. The wafer collecting section 10 includes a cassette C2 for housing the wafers W, each of which has been subjected to the separating process, in a stacked manner. The unit driving section 11 allows the tape joining unit 7 and the tape separation unit 8 to independently reciprocate laterally.

Herein, the wafer supply section 1, the wafer transport mechanism 3, the alignment stage 4, the holding table 6 and the wafer collecting section 10 are disposed at a top side of the base 12. The tape supply section 5 and the tape collecting section 10 are placed at a front side of a vertical wall 13 which is provided upright on the top side of the base 12. The joining unit 7 and the separation unit 8 are directed toward an opening formed below the vertical wall 13. The unit driving section 11 is disposed at a rear side of the vertical wall 13.

Figure 7:
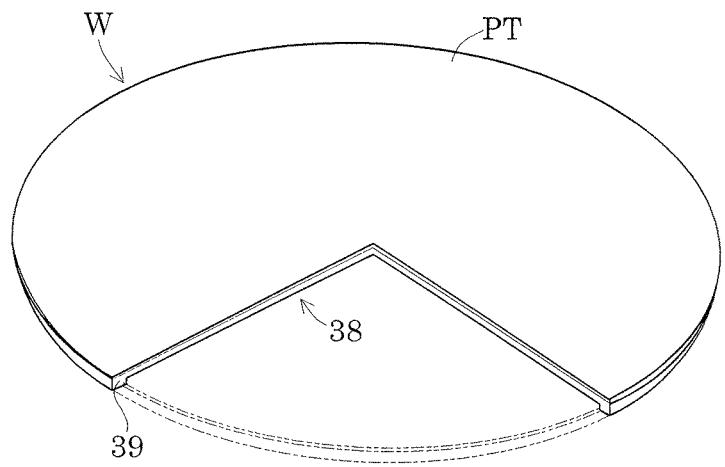
FIG. 7 is a partially-cutout perspective view illustrating a front face of a semiconductor wafer.

The wafer supply section 1 has the cassette C1 placed on a cassette table 14. As illustrated in FIG. 7, wafers W in a horizontal attitude are housed in the cassette C1 with an appropriate vertical clearance under a state where a surface of each wafer W, to which an ultraviolet-ray curable protective tape PT is joined, is directed upward. As illustrated in FIG. 3, the cassette table 14 is turnable by an air cylinder 15 such that a direction thereof is variable.

The wafer supply section 2 has the cassette C2 placed on a cassette table 16. Wafers W from which the protective tape is separated are housed in the cassette C2 with an appropriate vertical clearance. Also, the cassette table 16 is turnable by an air cylinder 17 such that a direction thereof is variable. Herein, the wafer W is irradiated with ultraviolet rays before being housed in the cassette C1 such that the protective tape PT is reduced in adhesion.

For instance, there are two types of wafers W to be processed. One wafer W is flat since a back grinding process is performed uniformly throughout the rear face thereof. The other wafer W has an annular projection remaining as to surround a back grinding region.

Figure 8:
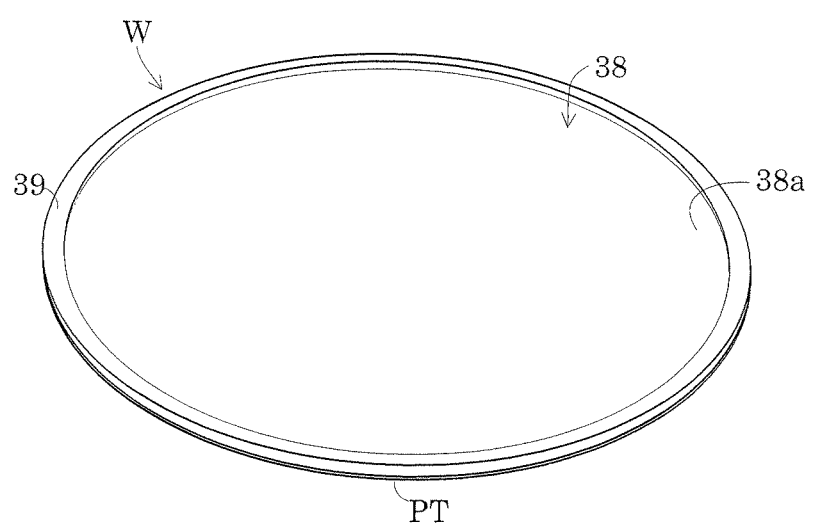
FIG. 8 is a perspective view illustrating a rear face of the semiconductor wafer.
Figure 9:
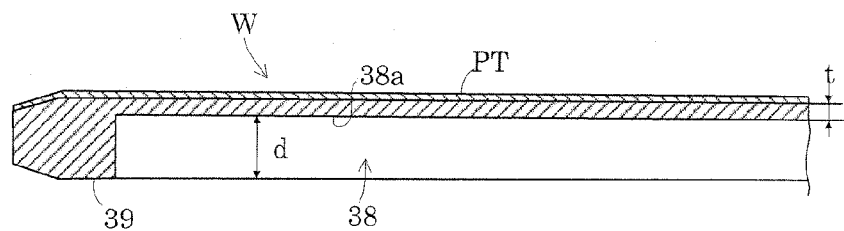
FIG. 9 is a partially-enlarged vertical sectional view illustrating the semiconductor wafer.

As illustrated in FIGS. 7 to 9, the wafer W having the annular projection formed on the rear face thereof is subjected to a back grinding process in a state where the protective tape PT is joined to a surface having a pattern formed thereon. A rear face of the wafer W is ground such that an outer periphery is higher than a ground area by about 2 mm in a radial direction. More specifically, a flat portion 38 is formed on the rear face and an annular projection 39 remains along the outer periphery of the rear face.

For instance, the flat portion 38 has a depth portion d ground to have a thickness of several hundreds μm. The wafer has a thickness t of tens μm at the ground region. The annular portion 39 formed at the outer periphery on the rear face of the wafer serves as an annular rib for reinforcement of rigidity in the wafer W. Accordingly, the annular projection 39 may suppress deformation due to deflection or warp of the wafer W during handling and other processes.

As illustrated in FIG. 3, the robot arm 2 of the transport mechanism 3 horizontally moves forward/backward and upward/downward, and is turnable. The robot arm 2 has a tip end provided with a suction holding portion 2a in a U-shape. Thus, the robot arm 2 pulls out a wafer W from the wafer supply section 1, and supplies the pulled-out wafer W to the alignment stage 4. The robot arm 2 also transports the wafer W from the alignment stage 4 to the holding table 6. Moreover, the robot arm 2 transports the processed wafer W from the holding table 6 to the wafer collecting section 10 where the processed wafers W are collected.

As illustrated in FIGS. 1 and 2, the tape supply section 5 guides the adhesive tape T from an original tape roll TR toward the joining unit 7 and the separation unit 8 through a position above the holding table 6. The adhesive tape T to be used herein has a width smaller than a diameter of a wafer W.

Figure 10:
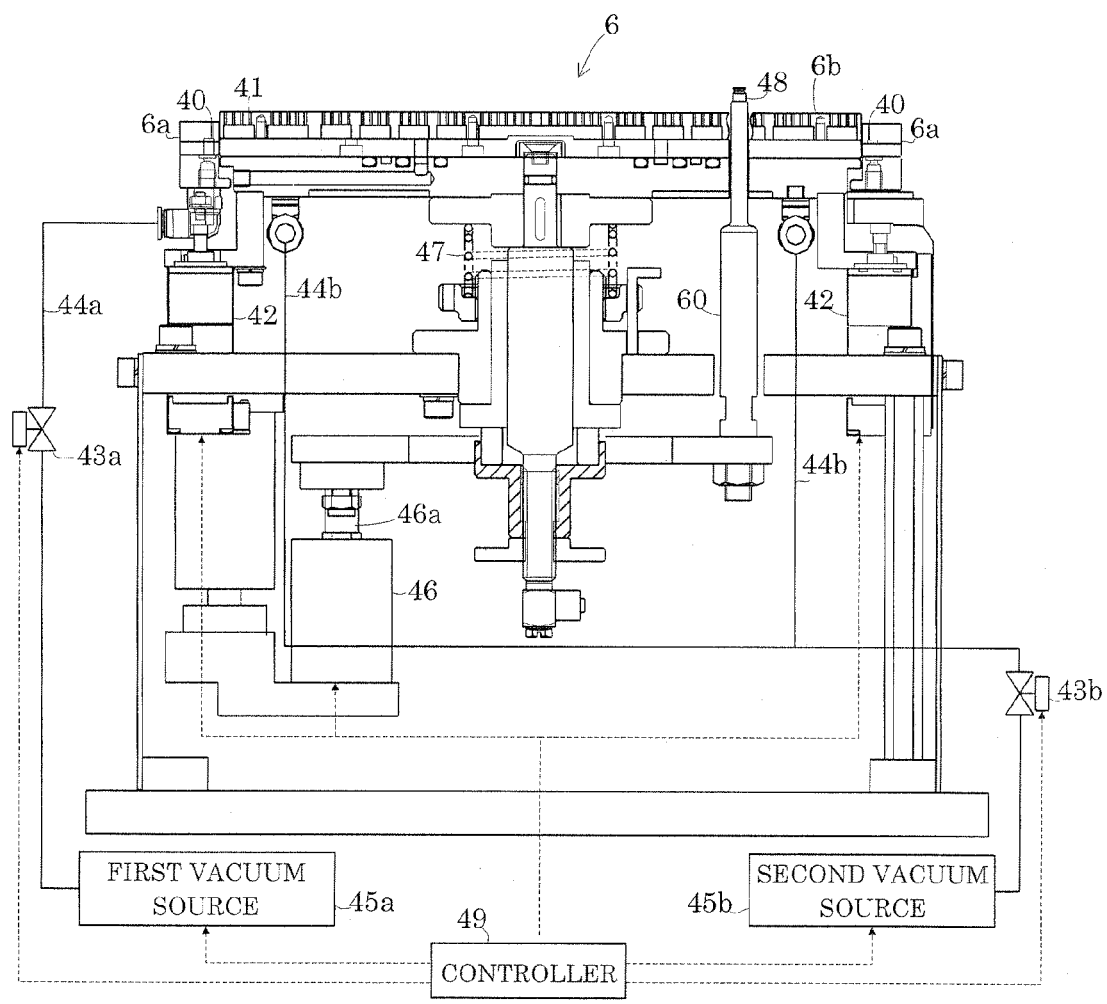
FIG. 10 is a vertical sectional view of a holding table.
Figure 11:
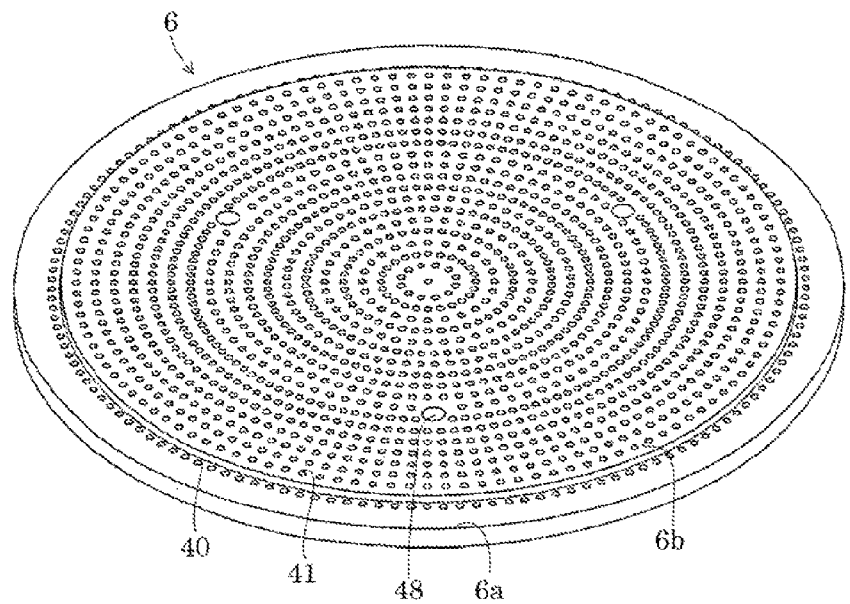
FIG. 11 is a perspective view illustrating a surface of the semiconductor wafer.
Figure 12:
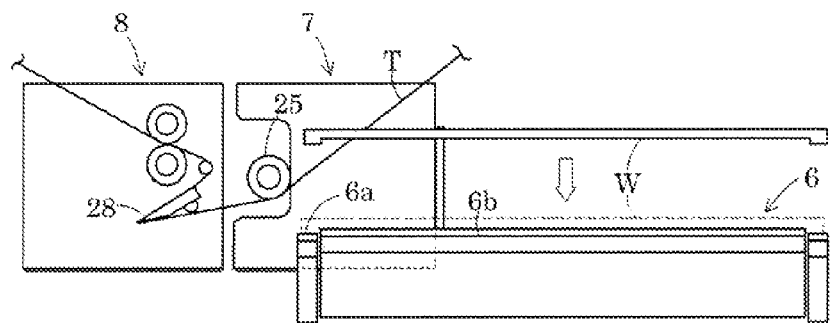
FIGS. 12 to 16 are front views each illustrating a tape separating step in the first embodiment.

As illustrated in FIGS. 10 and 11, the holding table 6 is formed of a first holding table 6a and a second holding table 6b. The first holding table 6a has suction holes 40 formed on the surface thereof that suction-hold the annular projection 39 on the rear face of the wafer W. The second holding table 6b is accommodated in the flat portion 38, and the outer periphery of the flat portion 38 is adjacent to the inner wall of the annular projection 39. As illustrated in FIGS. 8 and 9, the second holding table 6b has suction holes 41 on the surface thereof that suction-hold a flat plane 38a of the wafer W. The first holding table 6a and the second holding table 6b are each metal or ceramic chuck table.

Now referring again to FIG. 10. The first holding table 6a is connected to a linear actuator 42 formed of a stepping motor and a ball shaft. Forward/backward rotation of the stepping motor may cause the first holding table 6a to move upward and downward. Moreover, the suction holes 40 are brought together below the first holding table 6a to communicate with a first external vacuum source 45*a* via a first channel 44*a* with a first electromagnetic valve 43*a*.

The second holding table 6*b* is supported via a piston rod 46*a* as to move upward and downward while maintaining a horizontal attitude. An air cylinder 46 operates to move the piston rod 46*a* forward and backward. The second holding table 6*b* is biased upward with a spring 47 provided around a central guide shaft. Two or more support pins 48 are arranged at equal intervals on a given circumference of the second holding table 6*b*.

The suction holes 41 are brought together below the second holding table 6*a* to communicate with a second external vacuum source 45*b* via a second channel 44*b* with a second electromagnetic valve 43*b*.

The support pins 48 protrudes from or retracts into the holding surface of the second holding table 6*b* via an air cylinder 60. Moreover, the tip of the support pin 48 is formed of an insulator, or is covered with an insulator.

Figure 4:
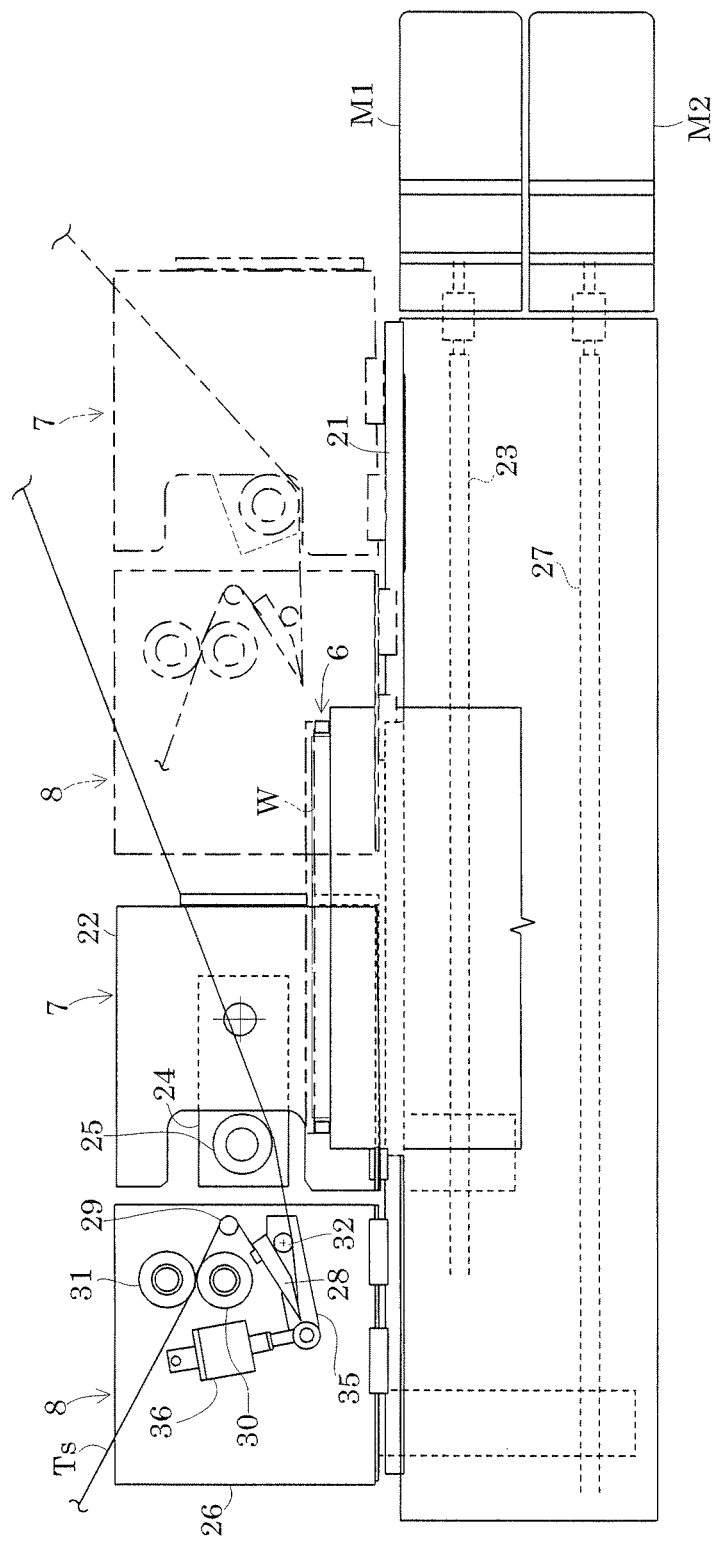
FIG. 4 is a front view illustrating a joining unit and a separation unit.

As illustrated in FIG. 4, the tape joining unit 7 has the following configuration. That is, a movable table 22 is supported so as to move laterally along a rail 21, and is allowed to reciprocate laterally and horizontally at a constant stroke through a feed screw 23 that is driven by a motor M1 in a forward/backward direction. Further, in the joining unit 7, the movable table 22 is equipped with a joining roller 25 movable vertically through a swinging arm 24. The joining roller 25 has a width larger than an outer diameter of the wafer W.

The separation unit 8 moves a movable table 26, supported to move horizontally along the rail 21, as to reciprocate horizontally at a constant stroke via a feed screw 27 that rotates backward and forward by a motor M2. The separation unit 8 further includes, on the movable table 26, a guide member 28 for tape separation, a guide roller 29, a feed roller 30 that is rotatably driven, and a nip roller 31 that is opposite to the feed roller 30. Here, the guide roller 28 corresponds to the separation member in this invention.

Figure 5:
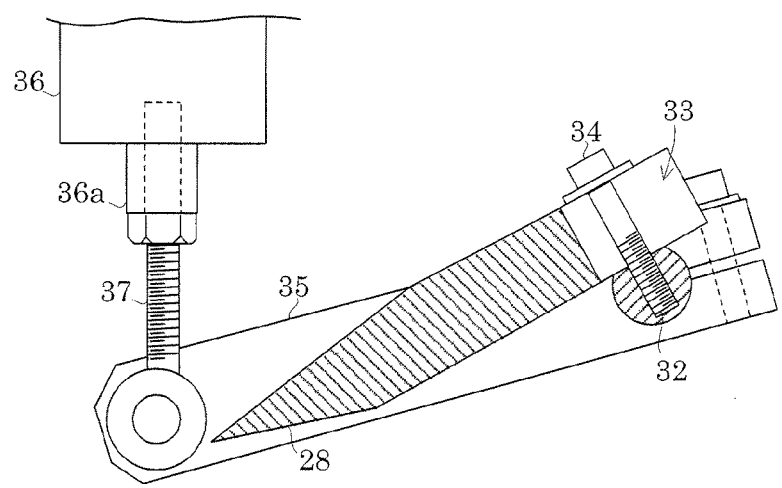
FIG. 5 is a front view illustrating a support structure of an edge member.
Figure 6:
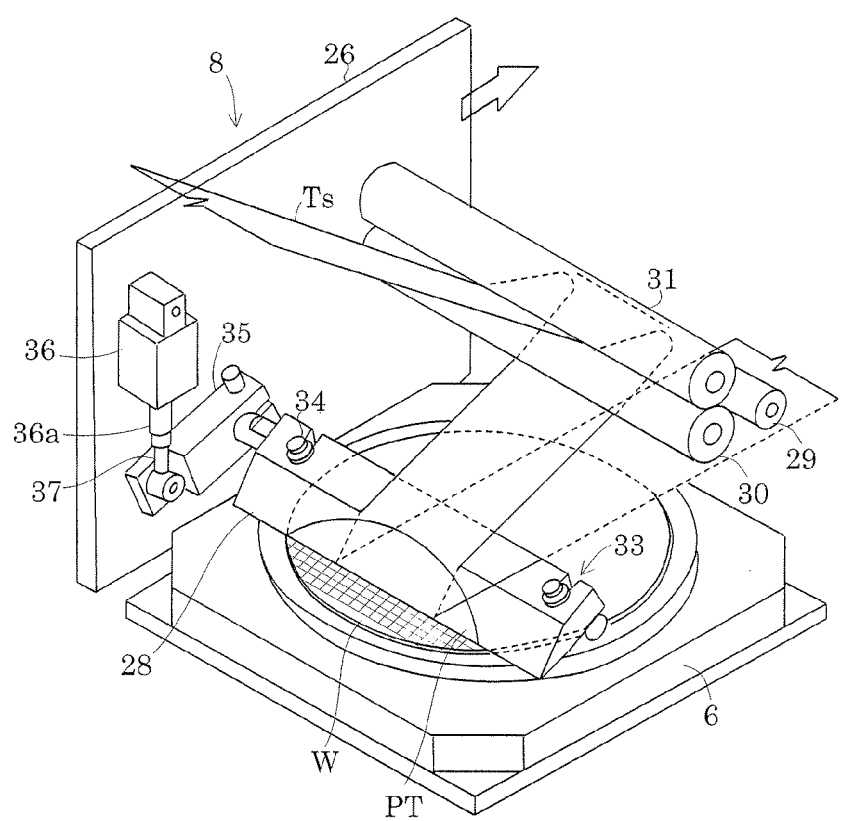
FIG. 6 is a perspective view illustrating operations of main components upon tape separation.

As illustrated in FIGS. 5 and 6, the guide member 28 is formed into a plate shape. Herein, a tip end of the guide member 28 is formed into a sharp edge, and a width of the guide member 28 is larger than an outer diameter of the wafer W. Moreover, the guide member 28 is fixedly connected to a rotational support shaft 32 through a slit 33 and a bolt 34 such that movement of the guide member 28 is adjustable. The rotational support shaft 32 is rotatably supported at the front side of the movable table 26. Moreover, an operating arm 35 is fastened to and connected to a base end of the rotational support shaft 32. Further, a connecting rod 37 is pivotally supported on and connected to a free end of the operating arm 35, and is connected to an air cylinder 36 which is attached to the front side of the movable table 26. The rotational support shaft 32 is rotated through swinging of the operating arm 35 in association with by movement of the air cylinder 36. With this operation, the tip end edge of the guide member 28 moves upward/downward.

In addition, the connecting rod 37 extends from the free end of the operating arm 35, and is screwed into and attached to a piston rod 36*a* of the air cylinder 36. Consequently, by controlling a screwed amount of the connecting rod 37, it is possible to adjust a swinging angle of the operating arm 35 when the piston rod 36*a* protrudes to its stroke end. In other words, it is possible to optionally adjust an angle of the edge member 28 located in a lower limit position.

The protective tape separation apparatus according to this invention is configured as above. Description will be given of processes for separating the protective tape PT joined to the surface of the wafer W having the annular projection 39 formed on the rear face thereof with reference to FIGS. 12 to 16.

An operator selects a wafer W to be processed from two or more types of wafers W having a given outer dimension via an operation panel. A controller 49 relatively moves upward and downward the first holding table 6*a* and the second holding table 6*b* in accordance with input data. That is, the second holding table 6*b* is controlled to have a level higher than that of the first holding table 6*a* such that the first holding table 6*a* suction-holds the annular projection 39 on the rear face of the wafer W and the second holding table 6*b* suction-holds the flat plane 38*a*.

Control in level of both holding tables 6*a*, 6*b* is completed, and then a tip end of the robot arm 2 is inserted into the cassette C1 in the wafer supply section 1. First, the robot arm 2 suction-holds a given wafer W from a side of the protective tape PT, takes the wafer W out of the cassette C1, and transfers the wafer W to the alignment stage 4. The alignment stage 4 performs alignment on the wafer W based on the detection results on a detection site, such as a notch formed in advance at an outer periphery of the wafer W. After performance of the alignment, the robot arm 2 again suction-holds the surface of the wafer W, and transfers the wafer W to both holding tables 6*a*, 6*b*.

The robot arm 2 moves downward. Accordingly, the controller 49 operates the first vacuum source 45*a* and the second vacuum source 45*b*, and opens both electromagnetic valves 43*a*, 43*b*. Here under this state, as illustrated FIG. 12, the second holding table 6*b* is brought into accommodation to the flat portion 38 to suction-hold the flat plane 38*a* with the suction holes 41. Simultaneously, the suction holes 40 of the first holding table 6*a* suction-hold the annular projection 39. That is, the first holding table 6*a* and the second holding table 6*b* perform suction-holding independently.

When the wafer W is transported to both holding tables 6*a* and 6*b*, the joining unit 7 and the separation unit 8 are located in standby positions, respectively, which are spaced away from the holding table 6 in a rearward direction.

Figure 13:
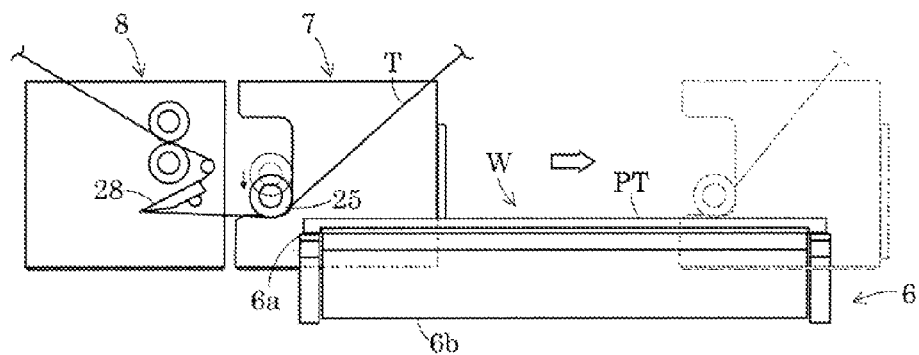

As illustrated in FIG. 13, the joining roller 25 of the joining unit 7 moves downward to a given joining level. Thereafter, the joining unit 7 moves forward as a whole, and the joining roller 25 joins the adhesive tape T to the surface of the protective tape PT while rolling on the surface of the wafer W.

Herein, the wafer W is deformed by the second holding table 6*b* biased upward with the spring 47 so as to slightly swell upward. The wafer W is flattened by being pressed with the joining roller 25 from above, so that the adhesive tape T is joined to the surface of the protective tape PT with accuracy due to a counterforce of the press.

Figure 14:
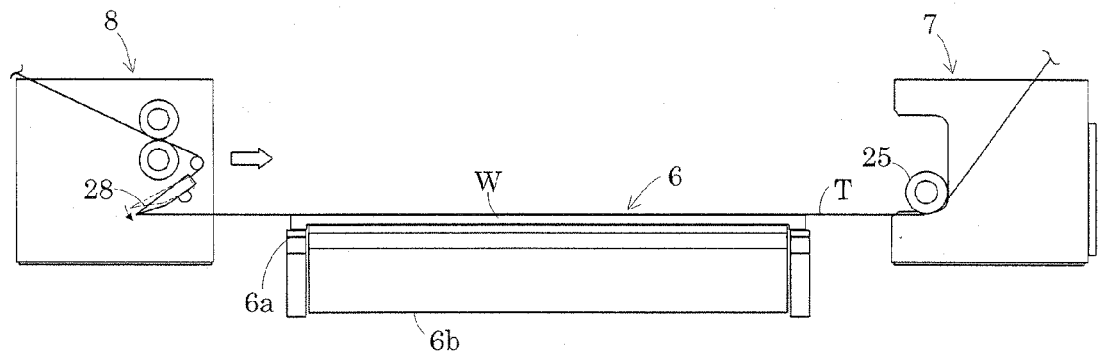

As illustrated in FIG. 14, upon completion of joining the adhesive tape T, the air cylinder 36 of the separation unit 8 protrudes to its stroke end, and the guide member 28 moves downward to the lower limit position through swinging of the operating arm 35.

Figure 15:
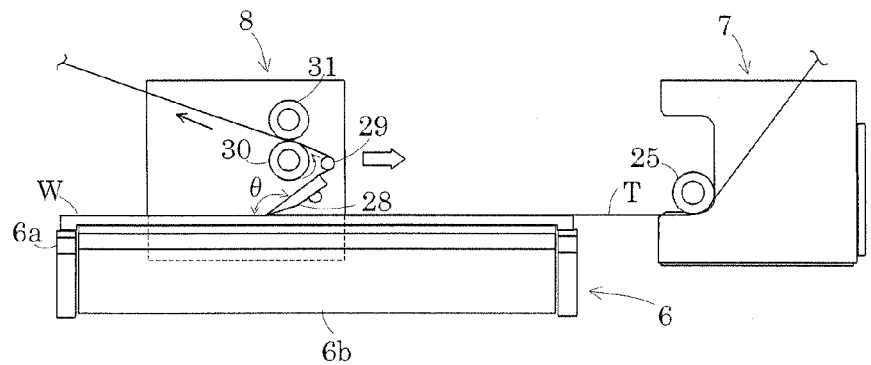

As illustrated in FIG. 15, next, the separation unit 8 moves forward. Herein, the tip end of the guide member 28 moves while pressing the adhesive tape T against the surface of the protective tape PT, and the feed roller 30 feeds out the adhesive tape T at a circumferential speed synchronized to a moving speed of the guide member 28. Accordingly, the adhesive tape T is folded by the tip end of the guide member 28 in a reverse direction at a folding angle θ, and then is guided into between the feed roller 30 and the nip roller 31 through the guide roller 29. As illustrated in FIGS. 6 and 15, then, the adhesive tape T travels with the protective tape PT integrated therewith, so that the protective tape PT is separated from the surface of the wafer W.

Herein, it is desirable that the folding angle θ of the adhesive tape T by the guide member 28 is set at a large angle, for example, 90° or more, preferably 100° or more. Alternatively, the folding angle θ of less than 90° (approximate to 90°) may be implemented depending on conditions such as a viscosity and an elasticity of the adhesive tape T, and a strength of the wafer W. Moreover, it is desirable that the folding angle θ of the adhesive tape T is set to be smaller as the elasticity of the adhesive tape T increases. This setting may be performed in such a manner that an angle of the guide member 28 in the lower limit position is adjusted by expansion/contraction of the connecting rod 37. Herein, variations in level of the guide member 28 in response to changing angles of the guide member 28 may be corrected through adjustment of an attachment position of the guide member 28 to the rotational support shaft 32.

A forward moving speed of the guide member 28 is made slow when the guide member 28 passes on the end of the wafer W to start separation of the protective tape PT, and, thereafter, such forward moving speed is made faster. Such configuration is preferable. This speed setting may achieve enhanced working efficiency. The feed roller 30 is rotatably driven with a driving device, not shown, through a slip clutch that idles by a load exceeding given torque. Therefore, the feed roller 30 feeds out the adhesive tape T while applying a given tension to the adhesive tape T.

Figure 16:
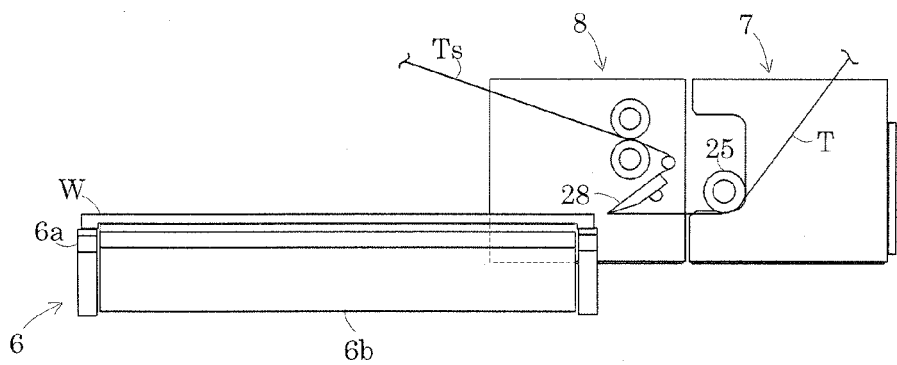
Figure 17:
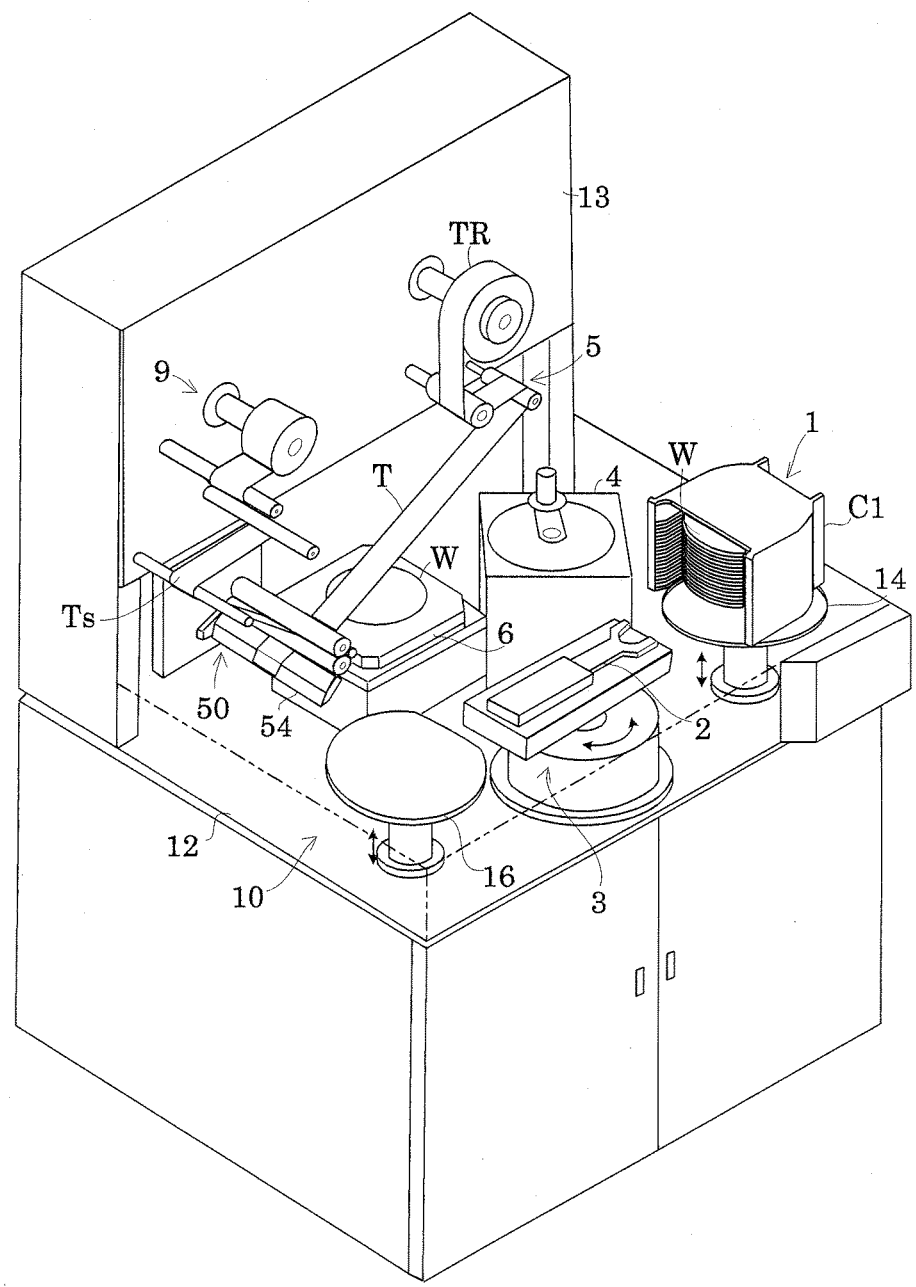
FIG. 17 is a perspective view illustrating a general configuration of protective tape separation apparatus according to a second embodiment.
Figure 18:
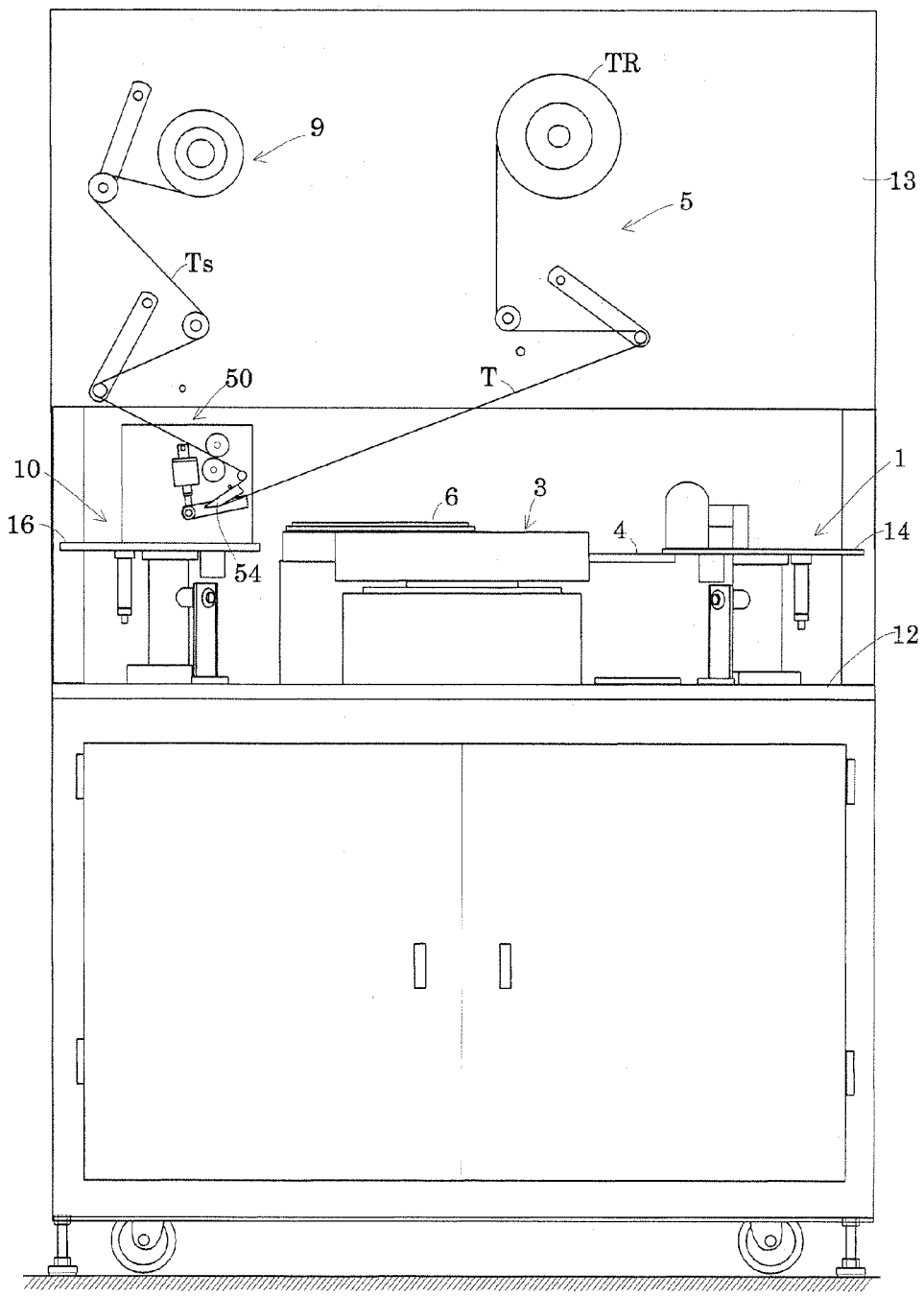
FIG. 18 is a front view illustrating the general configuration of the protective tape separation apparatus according to the second embodiment.
Figure 19:
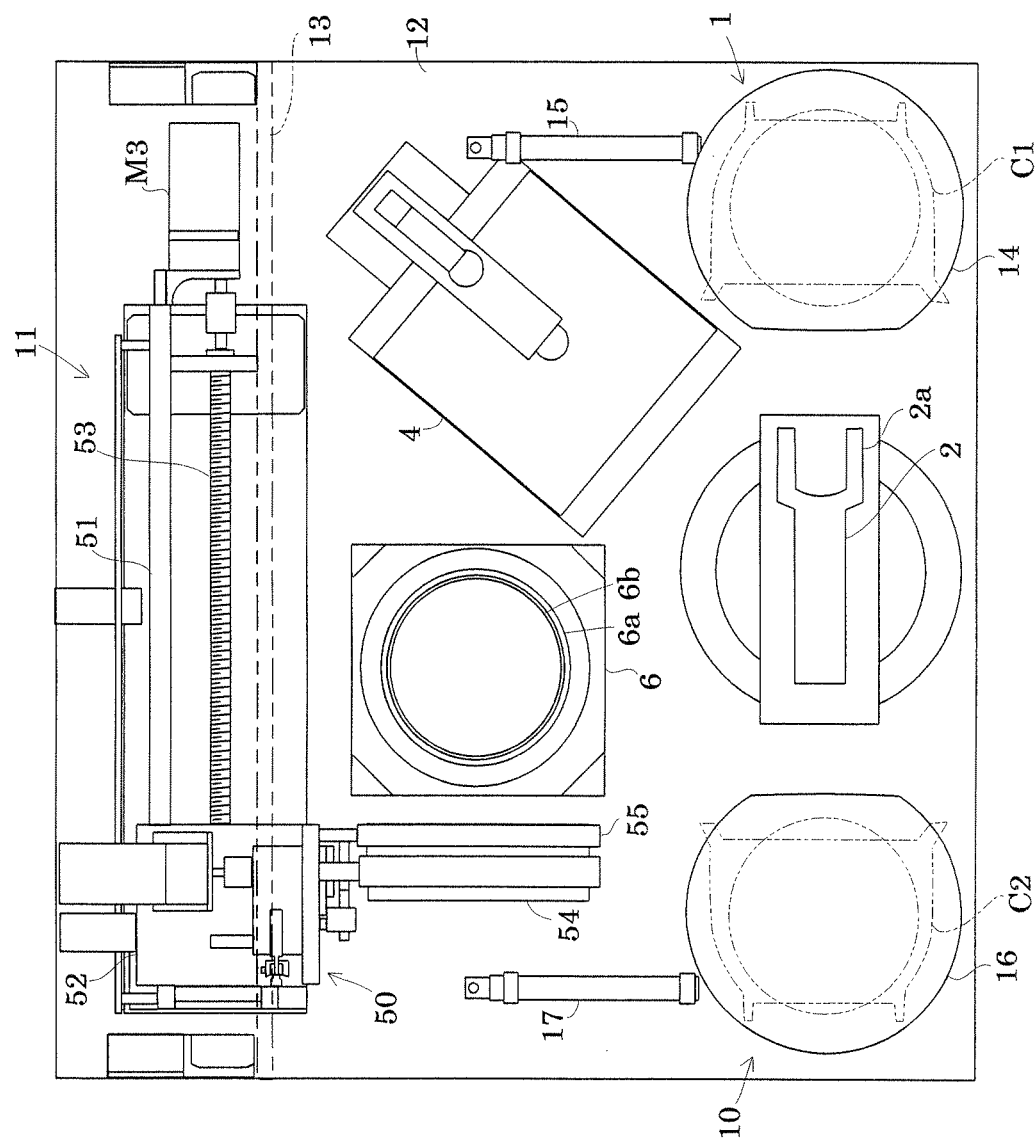
FIG. 19 is a plan view illustrating the general configuration of the protective tape separation apparatus according to the second embodiment.

As illustrated in FIG. 16, when the separation unit 8 passes above the wafer W and the protective tape PT is completely separated, the support pins 48 once push up the wafer W. Thereafter, the robot arm 2 transports the wafer W from the holding table 6 to the wafer collection section 10, and houses the wafer W in the cassette C2. On the other hand, the joining unit 7 and the separation unit 8 return to the respective standby positions and, also, the collection section 10 winds up and collects the adhesive tape Ts subjected to a separating process. In addition, the joining roller 25 and the guide member 28 move upward to return to the original standby positions, respectively.

Thus, a series of the separating adhesive tape joining process and the protective tape separating process is completed. Then, the protective tape separating apparatus is ready for reception of a subsequent substrate.

FIGS. 17 to 25 each illustrate apparatus for separating a protective tape from a semiconductor wafer according to a second embodiment of this invention.

In this embodiment, joining a separating adhesive tape T to a protective tape PT and separating the protective tape PT from the wafer W are simultaneously performed. Since the basic configuration is similar to that of the above first embodiment, the same members and elements as in the first embodiment are to be denoted with the same numerals. A different configuration is to be described as under.

Figure 20:
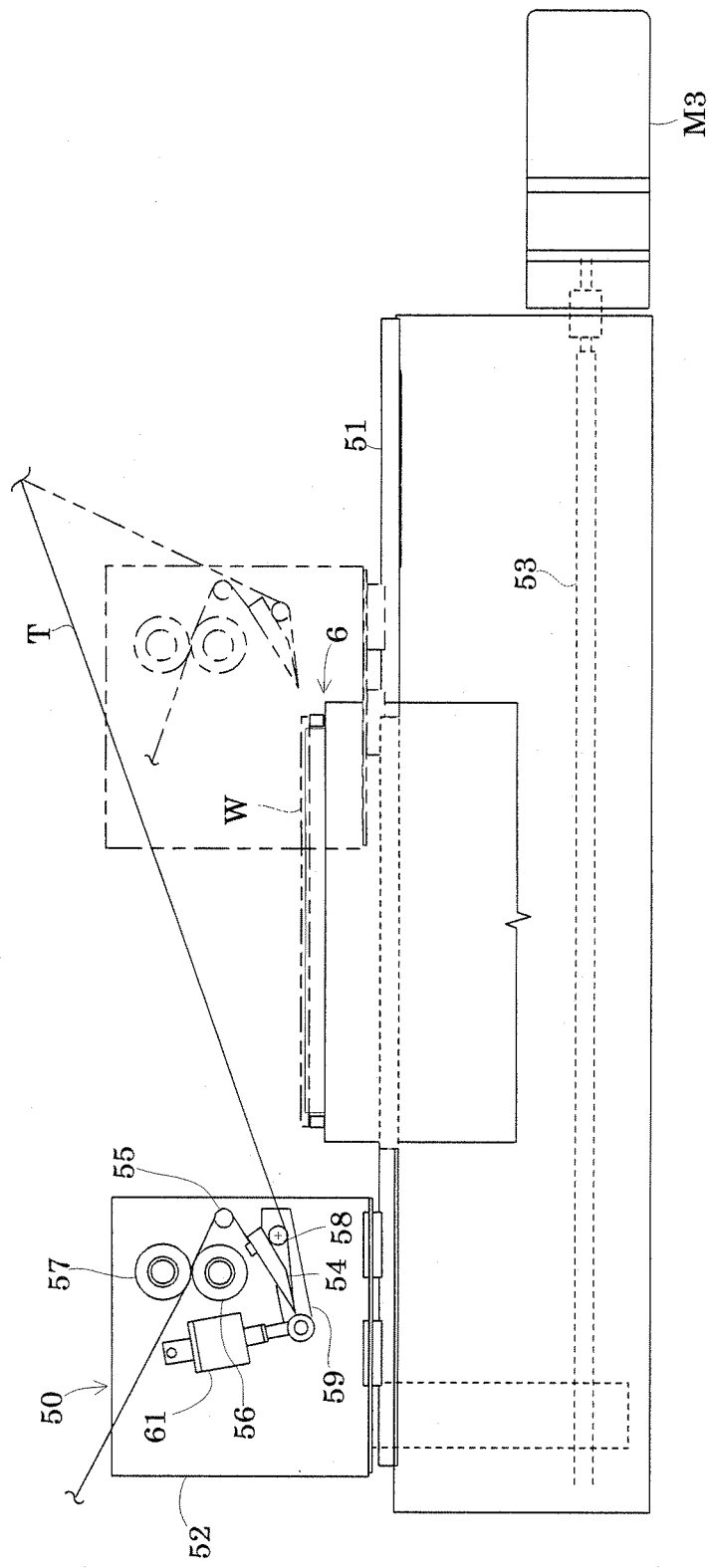
FIG. 20 is a front view illustrating a joining/separation unit according to the second embodiment.

As illustrated in FIG. 20, a joining/separation unit 50 is provided in place of the joining unit 7 and the separation unit 8 in the first embodiment. The tape joining/separation unit 50 has the following configuration. That is, a movable table 52 is supported on a pair of front and rear rails 51 so as to slidably move laterally along the pair of rails 51, and is allowed to move laterally and horizontally through a feed screw 53 that is driven by a motor M3 in a forward/backward direction. The movable table 52 is equipped with a guide member 54 also serving as a joining member, a guide roller 55, a feed roller 56 rotatably driven, and a nip roller 57 opposite to the feed roller 56.

The guide member 54 is formed into a plate shape. Herein, a tip end of the guide member 54 is formed into a sharp edge, and a width of the guide member 54 is larger than an outer diameter of the wafer W. Moreover, the guide member 54 is fixedly connected to a rotational support shaft 58 rotatably supported at a front side of the movable table 52 such that a forward/rearward position thereof is adjustable.

Moreover, an operating arm 59 is fastened to and connected to a base end of the rotational support shaft 58. Further, a free end of the operating arm 59 is connected to an air cylinder 61 that is attached to the front side of the movable table 52. The rotational support shaft 58 is rotated through swinging the operating arm 59 in association with expansion/contraction of the air cylinder 61. Accordingly, the tip end of the guide member 54 moves upward/downward.

Next, description will be given of basic processes of separating the protective tape PT joined to the surface of the wafer W with reference to FIGS. 21 to 25. In the second embodiment, operations until a wafer W is held on the holding table 6 are identical to those in the first embodiment. Therefore, description will be given of operations after the wafer W is held on the holding table 6.

Figure 21:
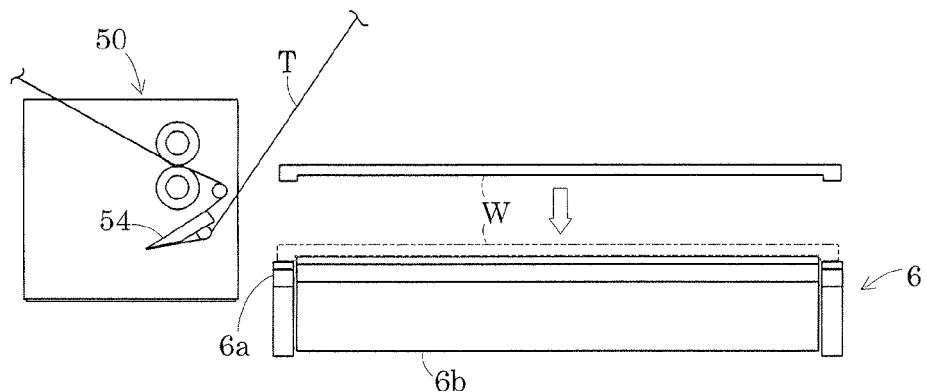
FIGS. 21 to 25 are front views each illustrating a tape separating step in the second embodiment.

First, as illustrated in. FIG. 21, the level of the first holding table 6a and the second holding table 6b is adjusted in accordance with a rear face shape of the wafer W that is selected by the operation section.

Figure 22:
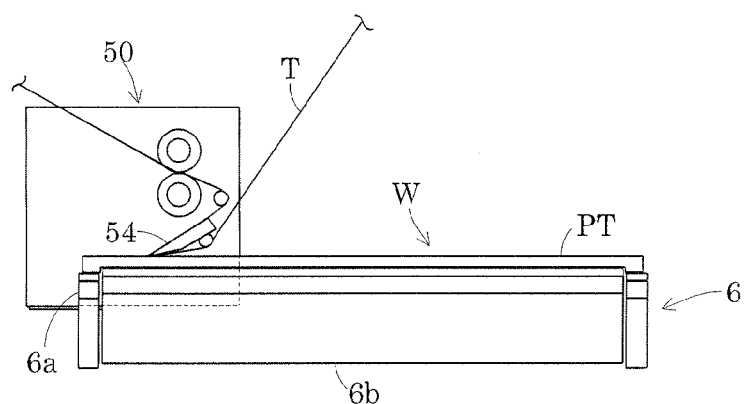

Next, as illustrated in FIG. 22, the suction holes 40 of the first holding table 6a suction-hold the annular projection 39 on the rear face of the wafer, whereas the suction holes 41 of the second holding table 6b suction-hold the flat plane 38a. Loading of the wafer W on both holding tables 6a and 6b is completed, and then the joining/separation unit 50 moves forward to a position above the wafer W. More specifically, the joining/separation unit 50 moves forward such that the tip end of the guide member 54 reaches a forward point spaced away by an appropriate distance from a circumferential end of the wafer W on a standby position side. At this point, the air cylinder 61 protrudes to its stroke end, and the guide member 54 is allowed to move downward to a lower limit position through operation of the operating arm 59. That is, the tip end of the guide member 54 comes into contact with a surface (non-adhesive surface) of the adhesive tape T, and then presses the adhesive tape T against a surface of the protective tape PT.

Figure 23:
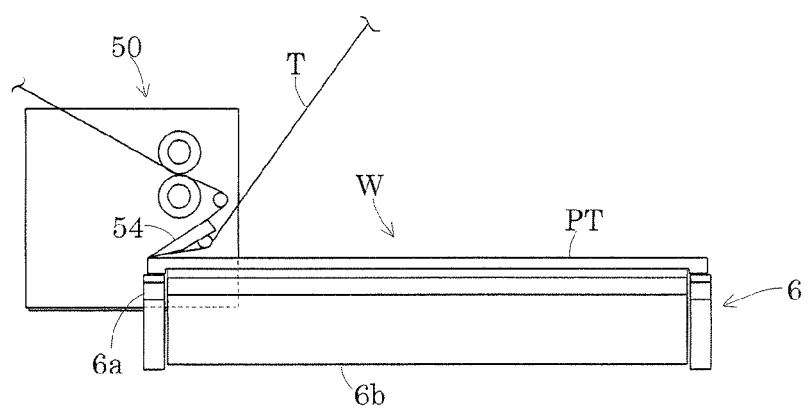

As illustrated in FIG. 23, when the guide member 54 moves downward, the joining/separation unit 50 moves rearward to its standby position. That is, the tip end of the guide member 54 joins the adhesive tape T to the surface of the protective tape PT while pressing the adhesive tape T against the protective tape PT.

Figure 24:
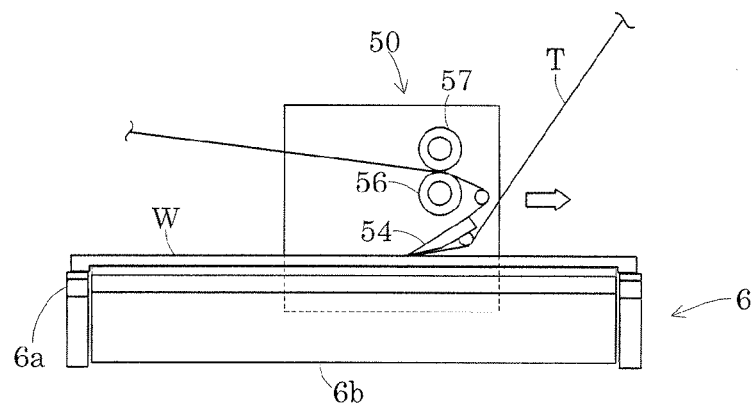

As illustrated in FIG. 24, when the tip end of the guide member 54 reaches the circumferential end of the wafer W, the joining/separation unit 50 moves forward in a reverse direction. Herein, the tip end of the guide member 54 moves while pressing the adhesive tape T against the surface of the protective tape PT, and the feed roller 56 winds up the adhesive tape T at a circumferential speed synchronized to the moving speed of the guide member 54. As described above, the joining of the adhesive tape T and the separation of the adhesive tape T are performed simultaneously, whereby the protective tape PT joined to and integrated with the adhesive tape T is separated from the surface of the wafer W together with the adhesive tape T.

Figure 25:
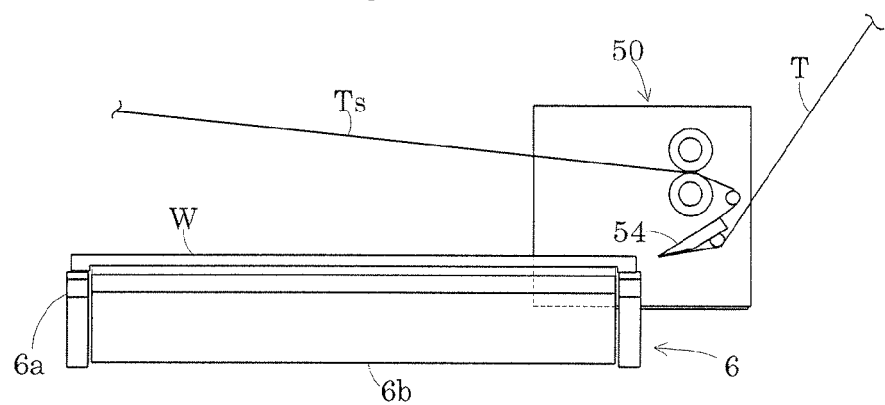

As illustrated in FIG. 25, the joining/separation unit 50 passes by the wafer W and the protective tape PT is completely separated from the surface of the wafer W. Thereafter, the robot arm 2 transports the wafer W from the holding table 6 to the wafer collection section 9 to house the wafer W in the cassette C2. On the other hand, the joining/separation unit 50 moves backward to return to its original standby position. Moreover, the tape collection section 9 winds up and collects the adhesive tape Ts subjected to the separating process. In addition, the guide member 54 moves upward to return to its original standby position.

Thus, a series of the protective tape separating processes is completed. Then, the protective tape separation apparatus is ready for reception of a subsequent wafer.

According to the foregoing exemplary apparatus, the first holding table 6a suction-holds the annular projection 39 at the outer periphery on the rear face of the wafer, and the second holding table 6b with an outer wall adjacent to the inner wall of the annular projection 39 accommodates the flat portion 38 through suction-holding the flat plane 38a. Consequently, the rear face of the wafer may be suction-held with stability.

As a result, separation stress concentrating at a joining portion of the annular projection 39 and the flat plane 38a upon separating the protective tape PT from the surface of the wafer W is to be canceled by reinforcement through suction-holding of the second holding table 6b. Consequently, cracks may be suppressed that possibly occur at the joint portion.

Moreover, the first holding table 6a and the second holding table 6b are controlled as to perform suction-holding independently. Accordingly, the following problem may be overcome. That is, even when suction force is reduced due to clogging of the suction holes 41 in the second holding table 6b or suction is eliminated due to failure of the second vacuum source 45b, the first holding table 6a may suction-hold the separation starting position of the protective tape PT with accuracy. Consequently, when a tension applied to the wafer W upon separation of the protective tape PT, the separation starting end of the wafer never floats. That is because suction of the first holding table 6a is larger than the tension. In other words, the protective tape PT may be separated from the surface of the wafer W with accuracy while poor separation is suppressed.

This invention may be modified as follows.

(1) In each of the foregoing embodiments, the following configuration may be adopted. That is, the rear face shape of the wafer W is distinguished automatically, and the first holding table 6a and the second holding table 6b move relatively upward and downward, whereby the surface level of the holding table 6 is automatically adjusted.

Figure 26:
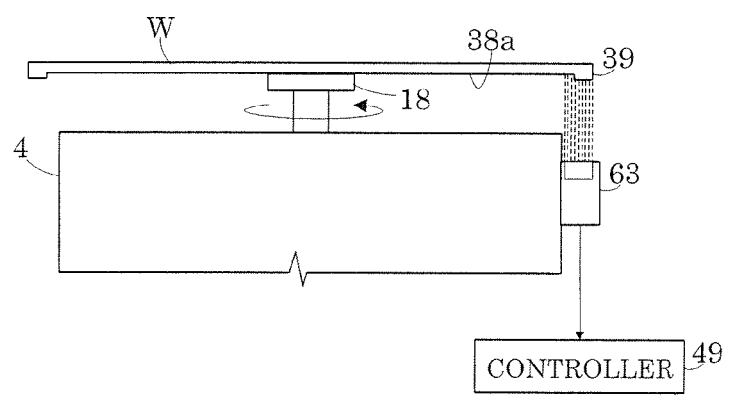
FIG. 26 is a plan view of an alignment stage according to one modification.

For instance, as illustrated in FIG. 26, when a notch is detected while the suction pad 18 of the alignment stage 4 suction-holds the rear face of the wafer W at the center thereof and rotates the wafer W, a displacement sensor 63 irradiates the outer periphery of the rear face with light and receives reflection light from the rear face. The controller 49 distinguishes whether the annular portion 39 is formed at the outer periphery on the rear face of the wafer W in accordance with variations in amount of light received relative to the amount of light outputted.

Figure 27:
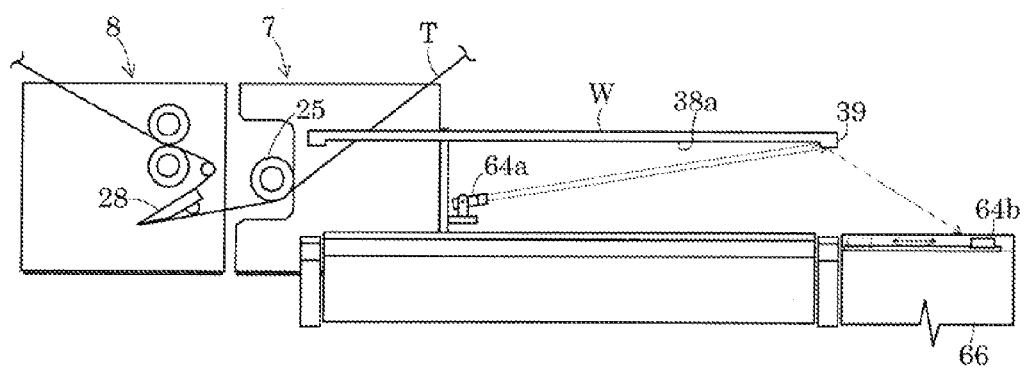
FIG. 27 is a schematic plan view of a holding table according to the modification.

Moreover, in another embodiment as illustrated in FIG. 27, a light sensor including a light emitter 64a and a light detector 64b facing to each other may be provided across the first holding table 6a. In other words, the light emitter 64a is located forward of the joining unit 7. The light detector 64b is located in a recess of an outer frame 66 provided at the outer periphery of the holding table 6. The recess is set to have a depth for allowing the light detector 64b to be received with no disturbance of movement of the joining unit 7. In addition, the recess has a rail along which the light detector 64b slidingly moves.

An irradiation angle of light from the light emitter 64a and a light receiving position of the light detector 64b are set to vary appropriately in accordance with the rear face shape of the wafer W. For instance, as in the case of the wafer W having a planar rear face, an angle of the light emitter 64a and a position of the light detector 64b are set such that light emitted to the outer periphery region from one end towards the other end thereof is entirely reflected, and the reflected light is received with the light detector 64b provided obliquely downward the reflected light. As in the case of the wafer W having the annular projection 39 on the rear face thereof, an angle of the light emitter 64a and a position of the light detector 64b are set such that only light reflected on the annular projection 39 may be received when light is emitted across the flat plane 38a and the annular projection 39.

The controller 49 distinguishes the rear face shape of the wafer W through comparison of an amount of received light obtained through the light detector 64b and a reference amount of received light determined from experiments or simulations with use of the wafer W having the annular projection 39 and the wafer W having a planar rear face. Then, the controller 49 controls a surface level of the first holding table 6a and the second holding table 6b in accordance with the distinction results.

(2) In each of the foregoing embodiments, the protective tape PT may also be separated from the surface of the wafer W having a rear face entirely subject to a back grinding process. Herein, the first holding table 6a has a surface level identical to the second holding table 6b, whereby the first holding table 6a suction-holds the outer peripheral region of the rear face, and the second holding table 6b suction-holds the center region of the rear face.

Figure 28:
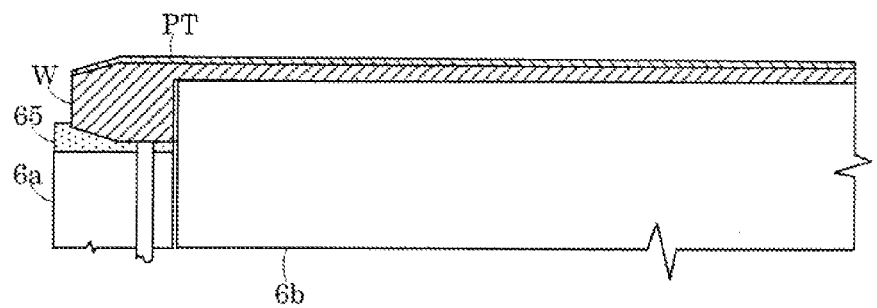
FIG. 28 is a partial sectional view of main components of the holding table according to the modification.

(3) In each of the foregoing embodiments, the first holding table 6a made from metal or ceramic is utilized. Alternatively, as illustrated in FIG. 28, the surface of the first holding table 6a may be covered with a porous elastic body 65.

According to this configuration, the wafer W has a bevel at the outer periphery thereof, and tends to curve convexly. Consequently, the elastic body 65 may elastically be deformed due to pressure from suction to adhere to the curved surface. Thus, leak during suction by the first holding table 6a may be suppressed.

Figure 29:
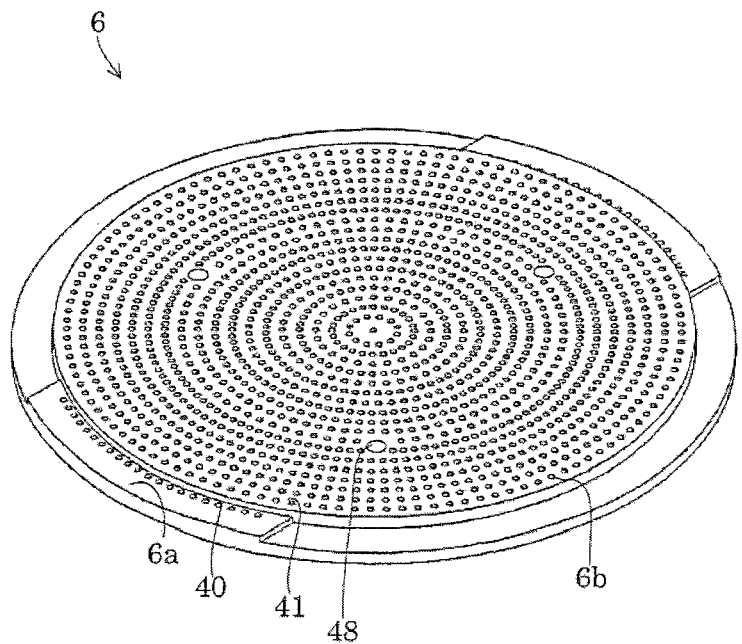
FIGS. 29 and 30 are perspective views each illustrating a surface of the holding table according to the modification.
Figure 30:
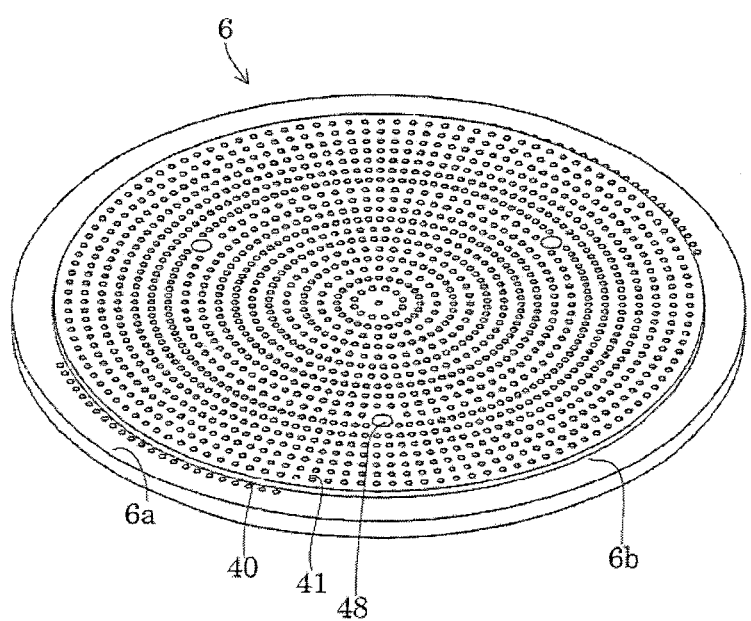

(4) In each of the foregoing embodiments, as illustrated in FIGS. 29 and 30, the suction holes 40 formed in the first holding table 6a may be provided on the joining starting end and joining termination end of the adhesive tape T by a tape width. Alternatively, the suction holds 40 may be provided only on the joining starting end.

(5) In each of the foregoing embodiments, the suction holes 40, 41 provided along the joining direction of the adhesive tape T are controlled as to perform suction independently for one row or two or more rows of holes.

According to this configuration, reduction in vacuum suction by the first holding table 6a may be minimized. Consequently, the protective tape PT may be successively separated. In other words, working efficiency may be improved while maintaining separation accuracy of the protective tape PT.

(6) In each of the foregoing embodiments, the guide member 28 or 54 for guiding the separating adhesive tape T in the reverse direction may be a roller with a small diameter.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of separating a protective tape joined to a semiconductor wafer, comprising the steps of:
   suction-holding a rear face of the semiconductor wafer by moving relatively a first holding table and a second holding table upward and downward so as to adjust a level of the first holding table and the second holding table, the first holding table suction-holding an outer peripheral region of the rear face of the semiconductor wafer at least at a location corresponding to a separating start position of the protective tape, the second holding table holding a middle region of the semiconductor wafer inside of the outer peripheral region; and
   separating the protective tape together with a separation tape from the semiconductor wafer by joining the separation tape to a surface of the protective tape on the semiconductor wafer while the semiconductor wafer is suction-held on the first holding table and the second holding table, and separating the separation tape together with the protective tape through folding back with a joining member.

2. The method of separating the protective tape according to claim 1, wherein
   the step of suction-holding the rear face of the semiconductor wafer includes:
   adjusting the first holding table and the second holding table as to have an identical surface level when suction-holding the semiconductor wirer having a rear thee to which a back grinding process is entirely performed uniformly; or
   suction-holding an annular projection with the first holding table and suction-holding a flat portion formed along an internal diameter of the annular projection with the second holding table having a contour adjacent to an inner wall of the annular projection through relatively moving the first holding table and the second holding table upward and downward when suction-holding the semiconductor wafer having the annular projection remaining on the outer periphery of the rear face thereof for surrounding a back grinding region.

3. The method of separating the protective tape according to claim 1, wherein surface levels of the first holding table and the second holding table are adjusted to correspond to the rear face of the semiconductor wafer through detecting light reflected at the outer periphery on the rear face of the semiconductor wafer with a detector and using the detected results with a controller.

4. The method of separating the protective tape according to claim 3, wherein
   the detector is provided on an alignment stage arranged prior to separating the protective tape together with a separation tape from the semiconductor wafer, and a condition of the outer periphery of the semiconductor wafer is detected during detection of an alignment mark while the semiconductor wafer rotates; and
   unevenness at the outer periphery is determined using the detected results.

5. The method of separating the protective tape according to claim 3, wherein
   the detector is formed of a light sensor having a light emitter and a light detector, and the light emitter is provided in a joining unit for joining a separating adhesive tape to the semiconductor wafer, whereas the light detector is provided outside a perimeter of the second holding table;
   the light sensor detects a condition at the outer periphery of the semiconductor wafer prior to joining of the adhesive tape; and
   unevenness at the outer periphery is determined through using the detected results with the controller.

6. The method of separating the protective tape according to claim 1, wherein
   the first and second holding tables are controlled as to perform suction-holding independently.

7. The method of separating the protective tape according to claim 1, further comprising a plurality of lines of suction holes formed on the surfaces of the first and second holding tables along a direction of joining the separation tape,
   wherein two or more suction holes for every line, or for two or more but not all lines, are connected to a corresponding vacuum source, and the suction holes are controlled as to perform suction-holding independently for every line, or for every said two or more but not all lines.

8. Apparatus for separating a protective tape joined to a semiconductor wafer, comprising:
   a first holding table for suction-holding at least an annular projection formed on an outer peripheral region on the rear face of the semiconductor wafer as to surround a back grinding region when the semiconductor wafer has the annular projection, the annular projection being placed on the first holding table and being suction-held at least at a location corresponding to the separation starting position of the protective tape, and suction-holding the outer peripheral region of the semiconductor wafer at least at the location corresponding to the separation starting position of the protective tape when a back grinding process has been performed uniformly on the entire rear face of the semiconductor wafer;
   a second holding table inserted into a flat portion inside the annular projection and adjacent to an outer periphery of the semiconductor wafer such that a flat plane of the flat portion of the semiconductor wafer is entirely suction-held when the semicomductor wafer having the annular projection is placed on the second holding table, and suction-holding a middle region of the semiconductor wafer when the semiconductor wafer having the entirely flat rear face is placed on the second holding table;
   a tape supply mechanism for supplying a separation tape to a surface of the protective tape on the semiconductor wafer suction-held on the first holding table and the second holding table;
   a tape separating mechanism for separating the protective tape together with the separation tape while folding back and separating the separation tape joined to the protective tape on the semiconductor wafer with a separation member;
   a tape collecting section for collecting the separated protective tape and the separation tape;
   a driving mechanism for moving upward and downward the first holding table and the second holding table;
   a controller for controlling suction and relative upward and downward movement of the first holding table and the second holding table, and
   a detector for detecting unevenness on the outer periphery of the rear face of the semiconductor wafer, wherein
   the controller distinguishes a semiconductor wafer having a flat rear thee from a semiconductor wafer having an annular projection formed at the outer periphery on the rear face thereof in accordance with detection results, and controls a surface level of the first holding table and the second holding table in accordance with the detection results.

9. The apparatus for separating the protective tape according to claim 8, wherein the detector is a light sensor provided in an alignment stage.

10. The apparatus for separating the protective tape according to claim 8, wherein the detector is formed of a light emitter provided in a joining unit for joining the separation tape to the protective tape and a light detector provided outside a perimeter of the second holding table.

* * * * *